(12) United States Patent
Bertin et al.

(10) Patent No.: US 6,410,431 B2
(45) Date of Patent: Jun. 25, 2002

(54) THROUGH-CHIP CONDUCTORS FOR LOW INDUCTANCE CHIP-TO-CHIP INTEGRATION AND OFF-CHIP CONNECTIONS (75) Inventors: Claude Louis Bertin, S. Burlington; Wayne John Howell, Williston; William R. Tonti; Jerzy Maria Zalesinski, both of Essex Junction, all of VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/746,534

(22) Filed: Dec. 19, 2000

Related U.S. Application Data (62) Division of application No. 09/056,277, filed on Apr. 7, 1998, now Pat. No. 6,222,276.

(51) Int. Cl.⁷ ............................................... H01L 21/44
(52) U.S. Cl. .................................................... 438/667
(58) Field of Search ........................... 257/774, 698; 438/928, 100, 101, 107, 122, 128, 129, 130, FOR 148, 343, 426, 346, 667, FOR 369

(56) References Cited

U.S. PATENT DOCUMENTS

| | | |
|---|---|---|
| 3,614,541 A | 10/1971 | Farrand |
| 4,954,458 A | 9/1990 | Reid |
| 5,128,831 A | 7/1992 | Fox, III et al. |
| 5,199,165 A | 4/1993 | Crawford et al. |
| 5,202,754 A | 4/1993 | Bertin et al. |
| 5,229,647 A | 7/1993 | Gnadinger |
| 5,270,261 A | 12/1993 | Bertin et al. |
| 5,322,816 A | 6/1994 | Pinter |
| 5,401,672 A | 3/1995 | Kurtz et al. |
| 5,406,120 A | 4/1995 | Jones |
| 5,419,806 A | 5/1995 | Huebner |
| 5,424,245 A | 6/1995 | Gutler et al. |
| 5,432,999 A * | 7/1995 | Capps et al. |
| 5,481,133 A | 1/1996 | Hsu |
| 5,502,667 A | 3/1996 | Bertin et al. |
| 5,510,655 A | 4/1996 | Tanielian |
| 5,528,080 A | 6/1996 | Goldstein |
| 5,585,675 A | 12/1996 | Knopf |
| 5,600,541 A | 2/1997 | Bone et al. |
| 5,616,517 A | 4/1997 | Wen et al. |
| 5,621,616 A | 4/1997 | Owens et al. |
| 5,640,051 A | 6/1997 | Tomura et al. |
| 5,926,951 A | 7/1999 | Khandros et al. |
| 5,936,843 A * | 8/1999 | Ohshima et al. |
| 6,002,177 A | 12/1999 | Gaynes et al. |

FOREIGN PATENT DOCUMENTS

JP          10-223833          8/1998

* cited by examiner

*Primary Examiner*—George Fourson
*Assistant Examiner*—Thanh V Pham
(74) *Attorney, Agent, or Firm*—Schmeiser, Olsen & Watts; Howard J. Walter, Jr.

(57) ABSTRACT

Through-chip conductors for low inductance chip-to-chip integration and off-chip connections in a semiconductor package is disclosed. A semiconductor device has active devices on the front surface, a first through-chip conductor having first electrical/physical characteristics passing from the front surface of the device to the back surface, a second through-chip conductor having second electrical/physical characteristics passing to the back surface, and an off-chip or chip-to-chip connector electrically connecting the active devices on the front surface to a different level of packaging.

6 Claims, 8 Drawing Sheets

THROUGH-CHIP CONDUCTORS FOR LOW INDUCTANCE CHIP-TO-CHIP INTEGRATION AND OFF-CHIP CONNECTIONS

This application is a divisional of Ser. No. 09/056,277, filed on Apr. 7, 1998 now U.S. Pat. No. 6,222,276.

BACKGROUND OF THE INVENTION

1. Technical Field

The invention relates generally to semiconductor interconnects, and more specifically, to chip-to-chip integration and off-chip connection schemes for semiconductor devices.

2. Background Art

A typical electronic system may comprise a variety of electronic components, fabricated on a variety of material. Very often, it is impossible for these various components to be integrated on a single substrate due to performance considerations or cost concerns. Consequently, these electronic components are packaged and externally electrically interconnected to function as a unit.

In the past, semiconductor packages have been electrically interconnected through wire bonding and/or the use of a C4 flip chip. Unfortunately, as packages become more dense and total performance gain becomes more important for high power chips in the system, the use of wire bonding and flip chips to form off-chip connections is not practical in many applications. Specifically, a significant performance degradation is caused by a wire bond induced parasitic inductance from a chip to a printed circuit board. Although a flip chip overcomes the parasitic inductance problem, the thermal properties of the flip chip severely limit the ability to cool high power chips, and adding an external heat sink to provide thermal conduction causes packaging constraint and increased chip operation ambient temperature.

There are inventions in the past with electronic components stacked together, whereby electrical communication between components are made possible via feed-throughs in the semiconductor bodies. Examples are found in the following U.S. Patents: U.S. Pat. No. 5,128,831, issued to Fox, III et al. in July 1992; U.S. Pat. No. 5,481,133, issued to Hsu in January 1996; U.S. Pat. No. 5,424,245, issued to Gurtler et al. in June 1995; U.S. Pat. No. 5,202,754, issued to Bertin et al. in April 1993; and U.S. Pat. No. 5,270,261, issued to Bertin et al. in December 1993. Although feed-throughs are used in the stacks, the assembled stacks are then attached onto a printed circuit board with the off-chip wiring schemes, long routing traces and all the associated prior art shortfalls. Furthermore, the aforementioned patents do not provide proper heat dissipation for high power chips, and low inductance connections to different levels of packaging, such as a circuit board.

SUMMARY OF THE INVENTION

It is thus an advantage of the present invention to provide through-chip conductors and chip-to-chip and off-chip connections for a semiconductor device and the method for making the same that eliminates the above described defects.

The advantages of the invention are realized by a semiconductor device having active devices on the front surface, a first through-chip conductor having first electrical/physical characteristics passing from the front surface of the device to the back surface, a second through-chip conductor having second electrical/physical characteristics passing to the back surface, and an off-chip or chip-to-chip connector electrically connecting the active devices on the front surface to a different level of packaging.

The foregoing and other advantages and features of the invention will be apparent from the following more particular description of preferred embodiments of the invention, as illustrated in the accompanying drawings.

BRIEF DESCRIPTION OF THE DRAWINGS

The preferred exemplary embodiments of the present invention will hereinafter be described in conjunction with the appended drawings, where like designations denote like elements, and.

DETAILED DESCRIPTION OF THE DRAWINGS

Figure 1:
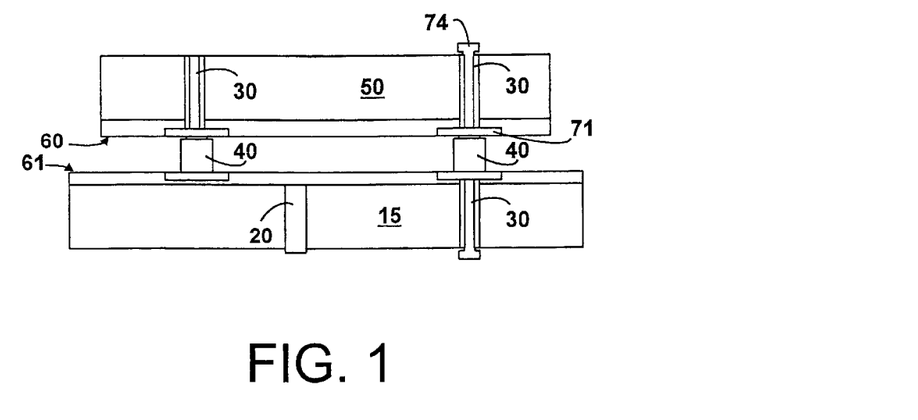
FIG. 1 is a simplified diagram of through-chip conductors and connectors for a semiconductor structure in accordance with a preferred embodiment of the present invention.

Referring to FIG. 1, a simplified diagram of a portion of a semiconductor package 10 in accordance with a preferred embodiment of the present invention is shown. For this example, semiconductor package 10 includes, but is not limited to, semiconductor chips 50 and 15, with active regions at the front surfaces 60 and 61 of the chips, contact pads 71, insulated through-chip conductors 30, thermal through-chip conductor 20, chip-to-chip connectors 40, and off-chip connectors 74. As shown, insulated through-chip conductors 30 may be coupled to off-chip connector 74 at the back surfaces of chips 50 and 15 in order to pass or receive electrical and/or physical characteristics (not shown) from the back surface to the front surface of the chips 50 and 15. Furthermore, insulated through-chip conductors 30 may be coupled to chip-to-chip connectors 40 at the front surface of chips 50 and 15 through contact pads 71. Chip-to-chip connectors 40 allow electrical characteristics of the active regions at the front surfaces 60, 61 or electrical/physical characteristics of the back surface of chips 50 and 15 to be passed from one chip to the other. In this example, thermal through-chip conductor 20 acts as a heat sink, providing heat dissipation for chip 15. As can be seen, the interconnections of the present invention provide high system packing densities and, as will be disclosed in greater detail below, also provide low inductance, high performance inter-chip and intra-chip communication and heat dissipation.

Figure 2:
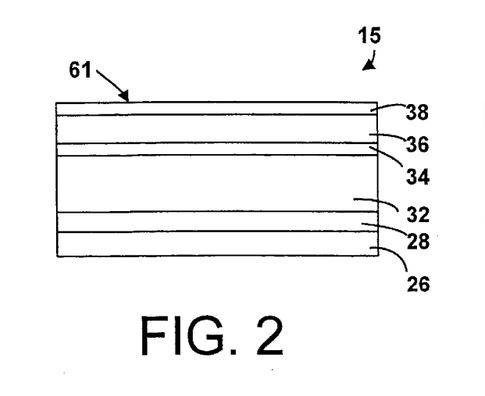
FIGS. 2, 3 and 4 are cross-sectional views showing a fabrication sequence of the through-chip conductors of FIG. 1 in accordance with an embodiment of the present invention.
Figure 3:
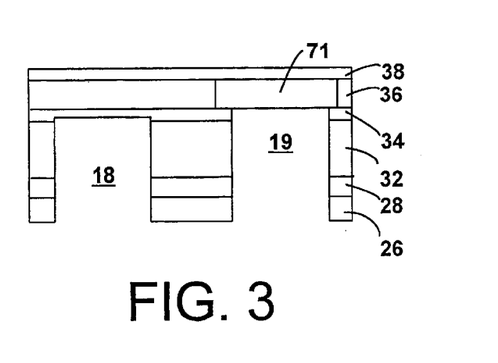
Figure 4:
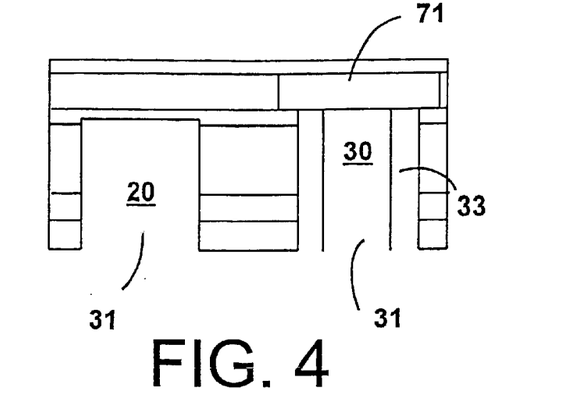

FIGS. 2–4 illustrate exemplary fabrication processes for the through-chip conductors 20 and 30 according to a first embodiment of the present invention. As seen in FIG. 2, an exemplary completed wafer for a chip 15 comprises wafer substrate 26 on the back surface of the chip, active silicon layer 28, additional metal and inter-layer devices 32, an optional nitride and/or laser stop 34, last metal layer 36, and final passivation layer 38. As aforementioned, these layers are exemplary layers for a completed wafer, wherein appropriate layers may be added or removed without changing the scope of the present invention. Also, although the final passivation layer 38 is not explicitly shown in other figures (e.g., FIGS. 1, 7, 8 etc.), it is to be understood that the final passivation layer 38 exists on each chip for the protection and isolation of the chip and only where contact is to be made, such as with a contact pad 71, a portion of the final passivation layer 38 will be removed (e.g., see FIG. 10). The thickness of the wafer is typically in the range of 250–300 micrometers ($\mu$m). Last metal layer 36 may consist of metals such as copper, aluminum, palladium, tungsten, or similar material, and may contain contact pad features, which will be shown further in reference to FIG. 4.

The through-chip conductors 20 and 30 are formed by first drilling holes 18 and 19 into the semiconductor substrate as shown in FIG. 3. The holes may be drilled by a variety of methods. Examples include laser drilling, abrasive jet blasting, or chemical etching. The side-walls of the holes are then insulated with insulating material 33 for the insulated through-chip conductor 30 as seen in FIG. 4. No insulation is needed for thermal through-chip conductors 20, since only heat dissipation is desired. An etch may be applied to the insulated through-chip conductor 30 or to the thermal through-chip conductor (see element 20A in FIG. 8) to couple the conductor to a contact pad 71. Finally, conductive materials 31, such as copper, are plated from the contact pad 71 or deposited into the holes to transform the vias into electrically and/or thermally conductive paths. Although copper plating is the preferred method of forming through-chip conductors 20 and 30, other appropriate processes, such as soldering a rod or wire to contact pad 71 after the holes are drilled, may also be used to achieve electrical/thermal conductivity.

Figure 5:
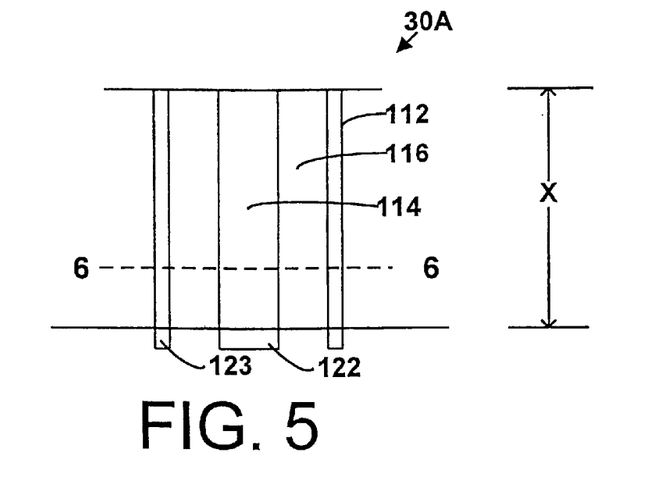
FIG. 5 is a cross-sectional view of a second embodiment of the through-chip conductor of FIG. 1.
Figure 6:
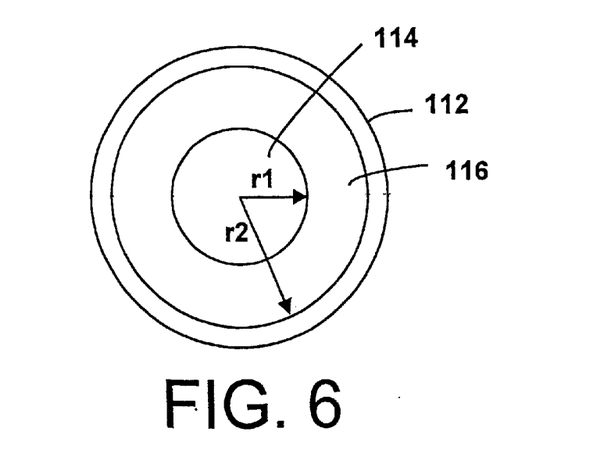
FIG. 6 is a perspective view of the cross-section illustrated in FIG. 5 taken along line 6—6.

A cross-section of a second embodiment of through-chip conductor 30A is shown in FIG. 5. Through-chip conductor 30A is fabricated for very high speed interconnections to support high performance operation and is interchangeable with any through-chip conductor 30 illustrated. Through-chip conductor 30A has an inner conductor 114, an insulation layer 116 (e.g., SiO2), and an outer conductor 112. Inner and outer conductors 112, 114 extend out 122, 123 from the substrate for accessibility. FIG. 6 illustrates the perspective view of the cross-section illustrated in FIG. 5 taken along line 6—6. The inductance for a line segment length X (FIG. 5) is given by the equation:

$$L = (uX/2\Pi)\ln(r1/r2)$$

wherein:
L=inductance;
u=magnetic permeability;
X=line segment length;
r1=inner conductor radius; and
r2=outer conductor radius.

The typical wirebond inductance is approximately 5 to 7 nanohenry (nhy). In comparison, with an inner radius r1=21.2 micrometers ($\mu$m), an outer radius r2=31.2 $\mu$m, a segment length X=250 $\mu$m, and a magnetic permeability of free space, u=u$_0$ (there is no magnetic material in the structure), the value of the inductance L for this example of the present invention is approximately 0.02 nhy. The extension 122 of the inner conductor 114 will add to the series inductance, and may add up to twenty percent of the segment for each line segment. However, even if L is increased from 0.02 nhy to 0.024 nhy, L is still more than 100 times smaller than the inductance of a wirebond connection.

The capacitance value for the segment of length X is given by the equation:

$$C = (\epsilon/t_{ox})(2\Pi r1)X$$

wherein:
C=capacitance;
$\epsilon$=electrical permitivity;
$t_{ox}$=dielectric thickness;
r1=inner conductor radius; and
X=line segment length.

Typical chip input capacitance is approximately 5 to 7 picofarads (pf). In this example, the approximate value of the capacitance C equals 0.2 pf for a dielectric thickness $t_{ox}$=10 $\mu$m, a relative dielectric constant $\epsilon_r$=4 (e.g., SiO2), r1=21.2 $\mu$m and X=250 $\mu$m. The capacitance of segment X is at least 25 times smaller than the chip input capacitance, therefore, the additional capacitive loading of the through chip connection is negligible.

The resistance value for the segment of length X is given by the equation:

$$R = (Rho)(X/Area); Area = 2\Pi r1^2$$

wherein:
R=resistance;
Rho=conductivity of the conductor;
X=line segment length; and
r1=inner conductor radius.

The resistance of a copper segment X=250 $\mu$m in length, with a radius r1=21.2 $\mu$m is approximately R=1.4 miliohms, which is a negligible increase in resistance.

Figure 7:
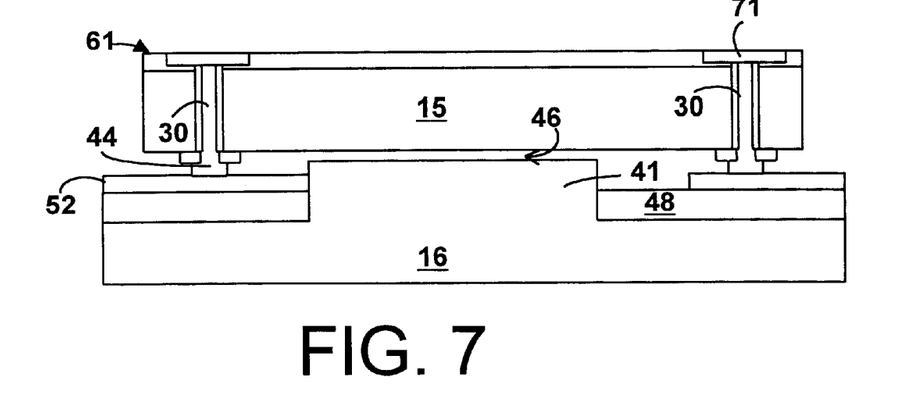
FIGS. 7, 8, and 9 are cross-sectional views showing exemplary off-chip connections to various heat sinks and circuit boards using the through-chip conductors of FIG. 1.
Figure 8:
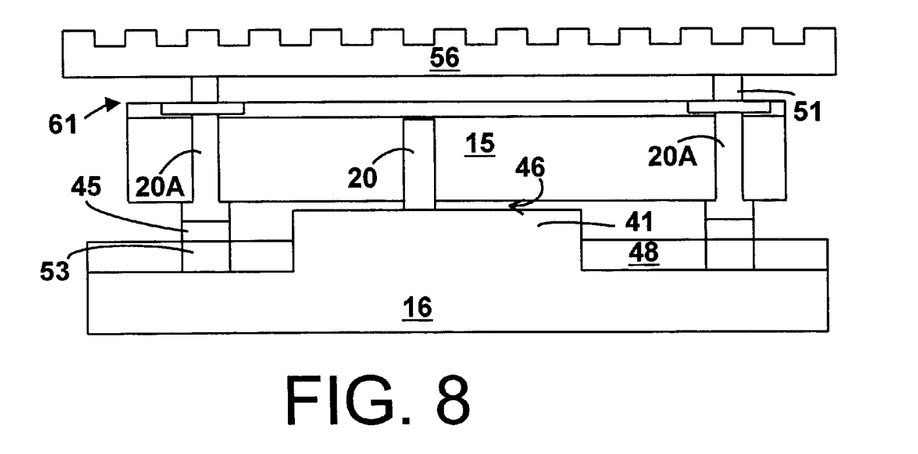
Figure 9:
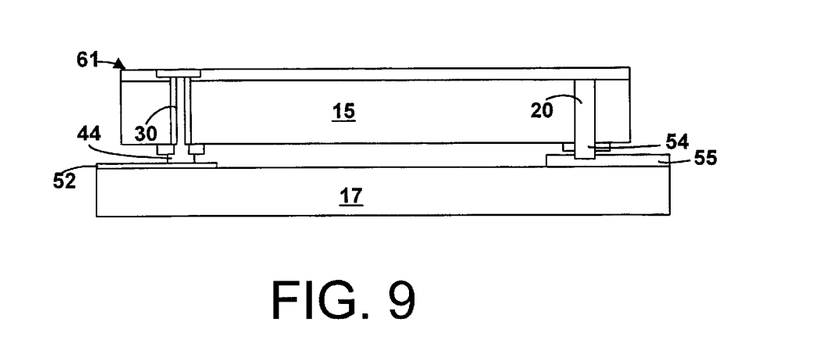

FIGS. 7–9 illustrate exemplary chip-to-circuit board connections using through-chip conductors in accordance with the present invention. As seen in FIG. 7, chip 15 comprises insulated through-chip conductors 30, contact pads 71 and active region 61. The integrated copper (or copper-invar-copper) core board 16 comprises an embedded heat sink 41, insulating layer 48 and electrical region 52. Chip 15 is connected to the integrated copper core board 16 through interconnect material 44 (e.g., solder) and insulated through-chip conductors 30. That is, insulated through-chip conductors 30 provide a low inductance electrical connection between the chip's active region 61 and the electrical region 52 of the circuit board 16. A thermal bond 46 is created between heat sink 41 and the back surface of chip 15 allowing for removal of additional heat in high power applications. Although only two through-chip conductors are shown in this and other examples, it is to be understood that any desired amount of through-chip conductors may be used.

Heat transfer may be maximized through use of thermal through-chip conductors 20A connecting to an external heat sink 56 and the integrated copper core board 16 through thermal interconnects 51 and 45 (e.g., solder), and thermal path 53 as shown in FIG. 8. Thermal through-chip conductor 20, which does not penetrate the front surface of the chip but terminates close to the active circuit region 61, directly connects to heat sink 41 to provide additional and enhanced localized cooling. Although thermal through-chip conductors 20A and 20 are shown, insulated through-chip conductors 30 may also be used to dissipate heat, or to pass electrical power through either heat sink into the chip for system use. Heat is now removed from chip 15 through external heat sink 56, heat sink 41, which directly connects to the chip's back surface, and through the thermal path 53 to the copper core of circuit board 16. The thermal through-chip conductors 20A maintain a uniform temperature distribution within chip 15, and allow the integration of a three-dimensional external heat sink 56 to conduct heat from regions which require such cooling.

Chip 15 may also be connected to a circuit board 17 without a heat sink as shown in FIG. 9. In this case, thermal conductivity is moderate, thus a thermal through-chip conductor 20 connected to a thermal path 55, or one that does not contact the circuit board (not shown) may be used as a heat sink 54. In this example, an insulated through-chip conductor 30 is also used as an electrical conductive path from circuit board 17 to front surface 61 of chip 15.

FIGS. 10–22 illustrate the fabrication of chip-to-chip connectors and the use thereof with through-chip conductors to connect two or more chips or similar devices.

Figure 10:
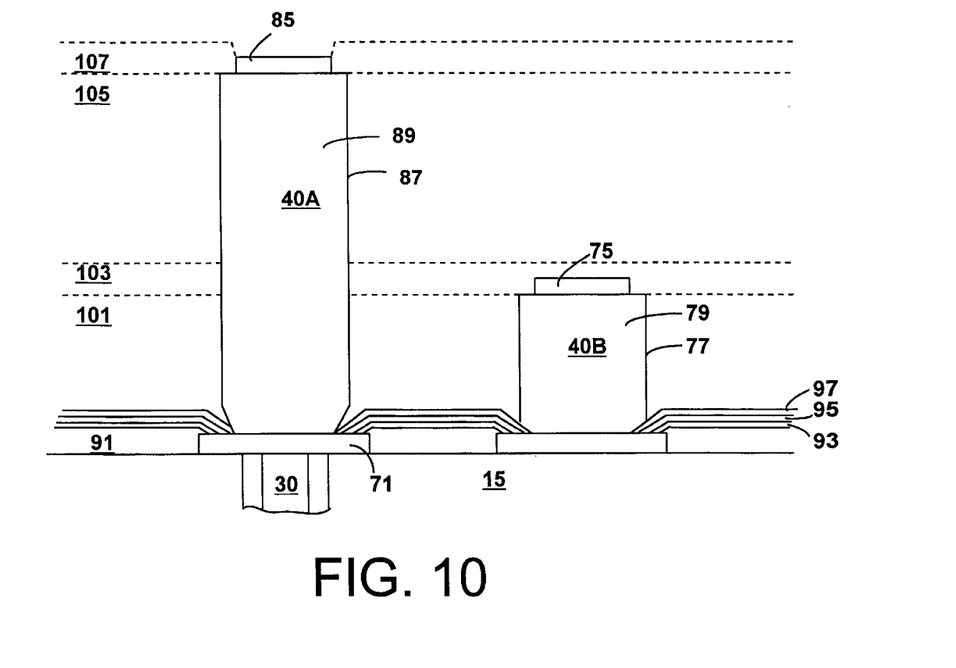
FIG. 10 is a cross-sectional view illustrating a fabrication of the chip-to-chip connectors of FIG. 1.

FIG. 10 illustrates an example of the fabrication of chip-to-chip connectors 40. Although for this example only two sizes 40A and 40B of chip-to-chip connectors are shown, it is to be understood that any appropriate amount and size of chip-to-chip connector may be used for this and subsequent examples. Before fabrication of chip-to-chip connectors 40, a dielectric layer 97, (e.g., a silicon-nitride layer (SiN)), may be deposited over other existing dielectric layers, such as silicon-oxide (SiO) layer 91, SiN layer 93 and SiO layer 95 of chip 15 to act as a barrier layer. The contact pads 71 are then exposed through an etching process and a first sacrificial insulation layer 101 is deposited to define the height of the smallest chip-to-chip connector 40B. Via holes 77 are then etched into the first sacrificial insulation layer 101 and copper 79 is plated to the surface of the via hole 77. As aforementioned in reference to the through-chip conductors, although copper is shown and preferred for this and other examples, other conductive materials and metals may also be used. The sacrificial insulation 101 undergoes a chemical mechanical polish (CMP), and a second sacrificial insulation layer 103 is deposited thereupon. A via hole is etched wherein a solder layer of uniform thickness 75 is plated. A second, taller chip-to-chip connector 40A is then similarly fabricated by depositing a third sacrificial layer 105, etching via hole 87, plating the hole with copper plating 89, depositing a fourth sacrificial layer 107 and plating a second solder layer 85. All sacrificial insulating layers are then removed, with dielectric layer 97, or optionally dielectric layer 95 acting as an etch stop.

Using sacrificial insulating layers and via etching as described above provides multiple chip-to-chip connectors of the same height. This process also allows for chip-to-chip connectors of varying heights, which can accommodate chips of different sizes, decoupling capacitors for power supply decoupling, heat sinks, etc. as will be illustrated in FIGS. 19 and 20. Additionally, the process allows for much tighter connector-to-connector spacings, less than 10 $\mu$m for example.

Figure 11:
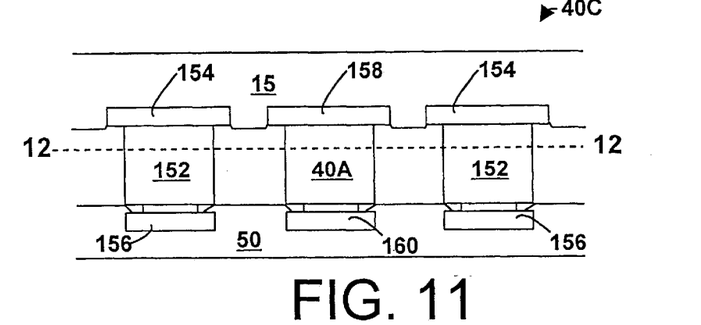
FIGS. 11, 12, 13 and 14 are cross-sectional views illustrating a second and third embodiment of the chip-to-chip connectors of FIG. 1.
Figure 12:
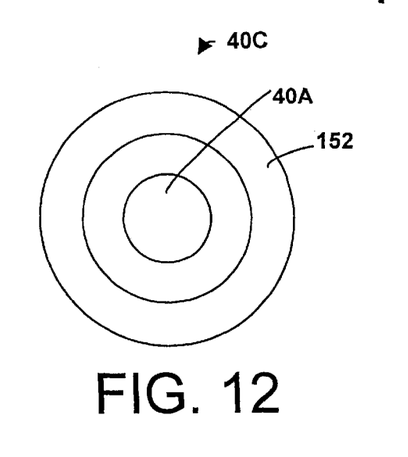

As shown in FIGS. 11–14, a chip-to-chip connector 40C or 40D may also be fabricated to form a coaxial high performance connection between chips. FIG. 11 illustrates a chip-to-chip connector 40C comprising a center conductor/connector 40A and an outer conductor 152. Connector 40A connects the signal pad 158 of chip 15 to pad 160 on chip 50. Outer conductor 152 is connected to ground pads, 154 and 156, although other options are possible. FIG. 12 illustrates the perspective view of the cross-section illustrated in FIG. 11 taken along line 12—12.

Figure 13:
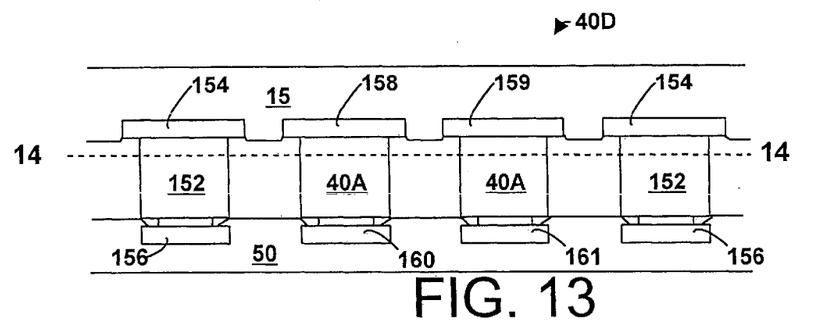
Figure 14:
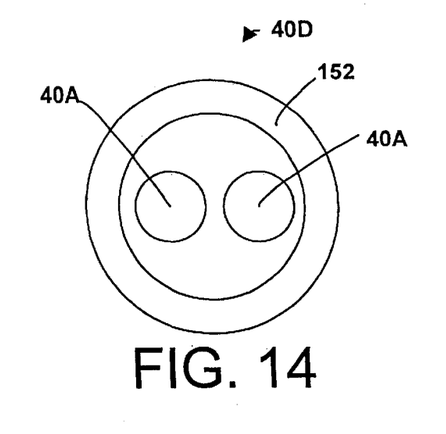

In FIG. 13, chip-to-chip connector 40D comprises two center connectors 40A and outer conductor 152. Connectors 40A connects two different signal pads 158 and 159 of chip 15 to pads 160 and 161, respectively, on chip 50. Again, outer conductor 152 is connected to ground pads, 154 and 156. FIG. 14 illustrates the perspective view of the cross-section illustrated in FIG. 13 taken along line 14—14. Although not shown, other arrangements may be made to improve conduction of chip-to-chip electrical characteristics, for example, conductors connecting signal pads may alter with conductors connecting ground pads. Thus, chip-to-chip connectors as shown in FIGS. 11–14, or other suitable arrangements, provide substantial improved electrical characteristics of connections between chips 15 and 50. As an example, for FIG. 11, if the center connector 40A is 500 $\mu$m long, the time delay between chips 15 and 50 is less than 2 ps.

Figure 15:
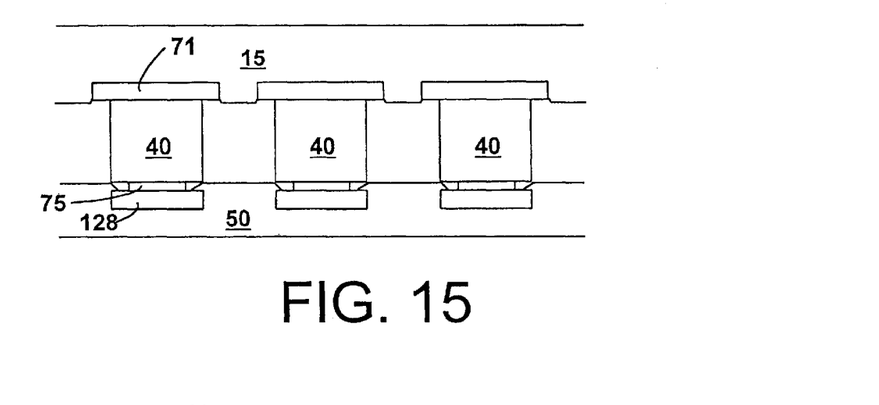
FIGS. 15, 16, 17, and 18 are cross-sectional views of chip-to-chip connectors of FIG. 1 and respective connections thereof.
Figure 16:
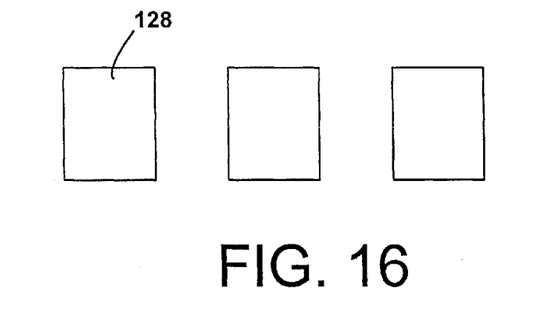
Figure 17:
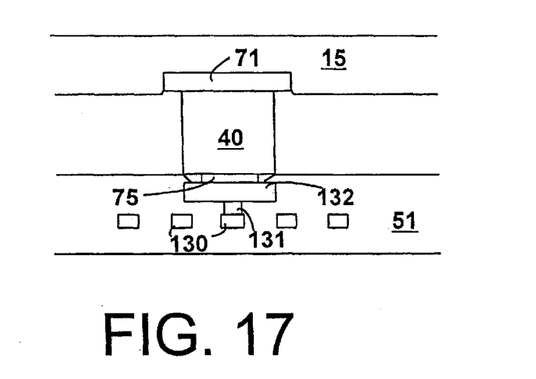
Figure 18:
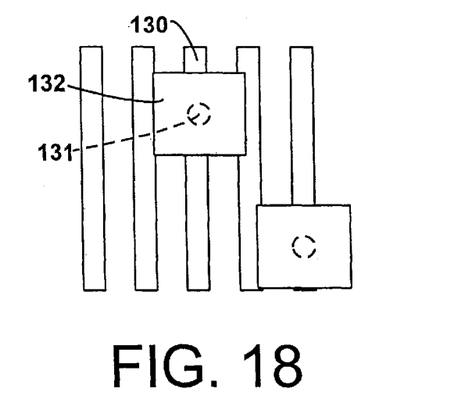

As shown in FIGS. 15–18, chip-to-chip connector 40 may be used to connect chips with contact pads having the same periodicity (i.e., the contact pads line up with each other, see FIGS. 15 and 16), or different periodicities (see FIGS. 17 and 18). Although specific examples and connections are shown for FIGS. 15–18, other appropriate examples may also be used.

As seen in FIG. 15, with similar periodicities, the contact pads 71 of chip 15 may be directly connected to the contact pads 128 of chip 50 with chip-to-chip connectors 40. Although elements 128 and 71 are described in this specific example as contact pads, elements 128 and 71 may also be a relatively wide buslines connected directly by chip-to-chip connector 40. FIG. 16 shows the top view of contact pads 128 on chip 50.

FIG. 17 illustrates how to connect chip 15 to chip wiring or busline 130 in chip 51 with a much tighter periodicity. The contact pads are connected by using a stud 131 between the busline 130 and a pad layer 132. The pad layers 132 are then staggered as shown in FIG. 18, which permits the connection of the contact pads 71 of chip 15 with the busline 130 of chip 51. FIG. 18 shows the top view of this arrangement. With such an arrangement, it would be possible, for example, to connect array drivers in one technology in a first chip to array lines in a memory chip, thus providing higher performance of the system.

Figure 19:
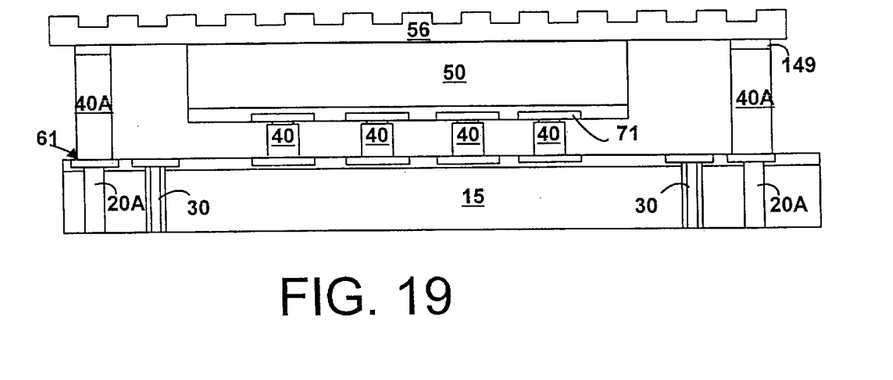
FIGS. 19, 20, 21 and 22 illustrate exemplary devices using the chip-to-chip connectors and through-chip conductors of FIG. 1.
Figure 20:
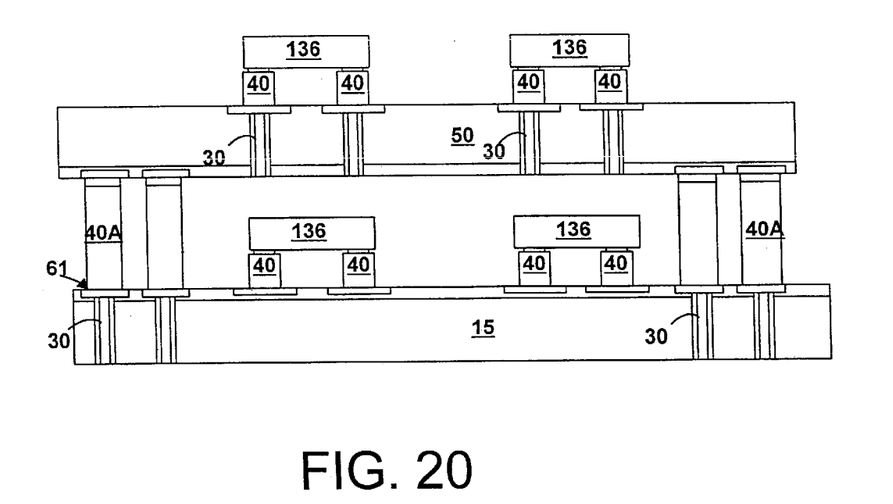

FIGS. 19 and 20 illustrate the use of chip-to-chip connectors 40 of mixed heights to accommodate different chip sizes and structures. As seen in FIG. 19, the active region of chip 50 is connected via chip-to-chip connectors 40 to the active region of chip 15. The external connections and electrical connections such as power, ground and signal (not shown) are made from the back surface of chip 15, and are conducted to the active regions of chip 50 and 15 via through-chip conductors 30. The thermal path is shown from the back surface of chip 15 through thermal through-chip conductors 20A, chip-to-chip connectors 40A, thermal adhesive 149, to external heat sink 56. Heat sink 56 provides cooling of chip 15 through the tall chip-to-chip connectors 40A, and direct cooling to chip 50. The taller connectors 40A have more ability to flex than the smaller connectors, and thus can support greater mechanical stress.

FIG. 20 illustrates a power supply decoupling capacitor configuration with mixed tall and short chip-to-chip connectors 40A and 40 on chip 15. Chip 15 may receive external electrical connections (not shown) through the back surface that includes power supply, ground and signal. The electrical characteristics are then conducted to the active regions of chip 50 and chip 15 through through-chip conductors 30 and chip-to-chip connectors 40A. Decoupling capacitors 136 are mounted on the front surface of chip 15 and on the back surface of chip 50. Chip-to-chip connectors 40A have sufficient height to accommodate the decoupling capacitors 136. The connections in FIGS. 19 and 20 are point-to-point connections, wherein only one connection is made to each of the chips in the stack. Point-to-point connections allow for minimized loading at each of the stack connections and thus faster performance of the system. More connections, though, and consequently, more space is required for point-to-point connections.

Figure 21:
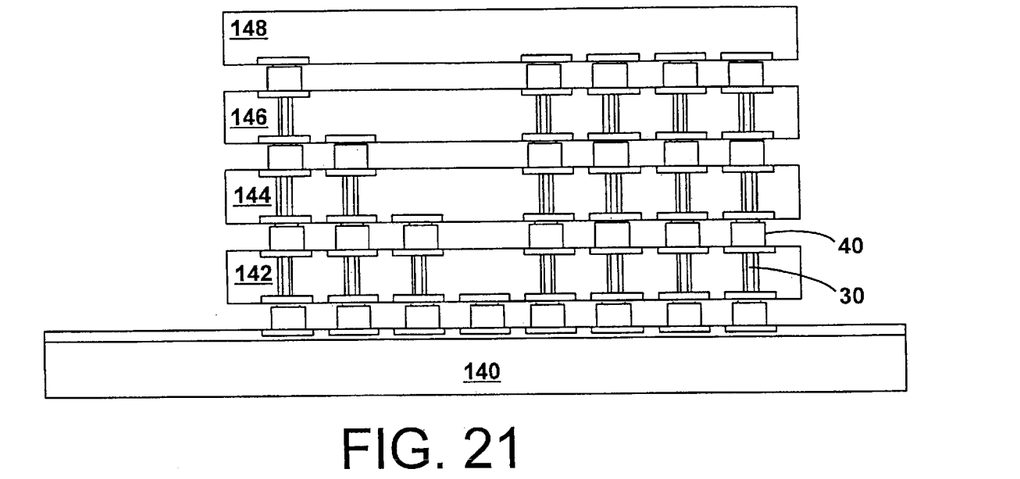
Figure 22:
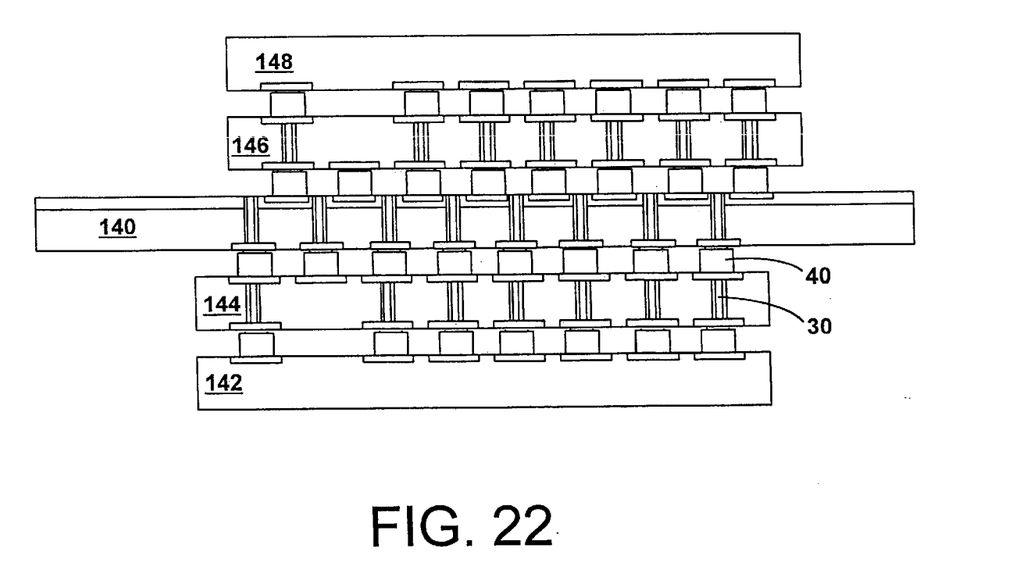

FIGS. 21 and 22 illustrate the ability to stack similar chips while providing high speed chip-to-chip connections through the silicon. As seen in FIG. 21, a stack of chips 142, 144, 146 and 148 is mounted directly on device 140, such as a logic chip, carry-card, microprocessor, controller, etc., to minimize latency between the device and chips and to maximize bandwidth. Each chip is mounted with the active area facing down, and is configured for its position in the stack. The first four connections connect the device 140 to each chip, wherein the first connection connects to a receiver on chip 148 and requires three chip-to-chip connectors to reach it, the second connection connects to chip 146, the third connection to chip 144 and the fourth connection to a low capacitance receiver on chip 142. Each of the next four connections shown connect to all four chips. These last four connections allow for parallel input/output connections. FIG. 22 shows device 140 having through-chip conductors , such that the stack may be mounted with two chips on each side of the processor for even higher performance.

In the chip stacks of FIGS. 21 and 22, or similar stack structures, the knowledge of whether these interconnections through multiple chips behave as lumped capacitances and inductance, or as transmission lines is important. That is, high speed transmission lines usually require termination to avoid reflection while lumped capacitive and inductive elements do not. The electrical behavior is determined by the round trip delay time in relation to the rise time (or fall time) of the waveform. If the rise (or fall) time $t_{rt}$ of the waveform is greater than two times the round trip transmission line delay $t_d$ ($t_{rt} > 2t_d$), lumped capacitance and inductance assumptions may be used (as described in "Cross Talk and Reflections in High Speed Digital Systems", Feller et al, RCA, Proceedings-Fall Joint Computer Conference, 1965).

For chips 250 $\mu$m thick, the round trip delay through one segment is less than 2 picoseconds (ps). For a stack of chips 4 high, the round trip delay is less than 8 ps, and for a stack of chips as high as 20, the round trip delay is less than 40 ps. In the case of a 20 chip stack, the inductance for a 20 chip stack, with 20 segments, is less than ½ nhy, and the capacitance for 20 segments is less than 4 pf. Thus, the combined inductance and capacitance of a stack of 20 chips may be treated as lumped elements up to a frequency of 4 Giga Hertz (GHz). Above 4 GHz, the segments would behave as transmission lines requiring terminations. Furthermore, connections inside silicon are capable of very high frequency characteristics without cross talk and without radiation.

Thus, the through-chip conductors and connectors according to an embodiment of the present invention provides high system packing densities, as well as low inductance, high performance inter-chip and intra-chip communication and heat dissipation.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A method of electrically and thermally connecting a semiconductor device having a front surface with active devices and a back surface to a different level of packaging, comprising:

(a) providing at least one first through-chip conductor and at least one second through-chip conductor;

(b) electrically passing a first characteristic through the first through-chip conductor, from said active devices of said semiconductor device to said different level of packaging, wherein the first characteristic comprises an electrical/physical characteristic; and (c) passing a second characteristic through the second through-chip conductor to said back surface of said semiconductor device, wherein the second characteristic comprises a thermal characteristic;

wherein said step b) further comprises the steps of:
        b1) providing at least one chip connector; and
        b2) electrically connecting said active devices of said semiconductor device to said different level of packaging with said chip connector;
    wherein said step b1) further comprises:
        1) depositing a first sacrificial layer on said semiconductor device;
        2) etching a pair of first via holes in said first sacrificial layer;
        3) plating a first conductive material in at least one of said first via holes;
        4) depositing a second sacrificial layer on said first sacrificial layer;
        5) etching a second via hole in said second sacrificial layer, wherein said second via hole connects with at least one of said first via holes;
        6) plating a second conductive material in said second via hole, and said first via hole connected therewith; and
        7) removing said first and second sacrificial layer.

2. The method of claim 1, further comprising the steps of:
    coupling said different level of packaging to said back surface of said semiconductor device.

3. The method of claim 2, wherein said different level of packaging is a circuit board.

4. The method of claim 1, wherein said first conductive material is copper.

5. A method of fabricating a pair of chip connectors for a semiconductor device, comprising:

a) depositing a first sacrificial layer on said semiconductor device;

b) etching a first via hole in said first sacrificial layer;

c) plating a first conductive material in said first via hole;

d) depositing a second sacrificial layer on said first sacrificial layer;

e) etching a second via hole in said second sacrificial layer and said first sacrificial layer;

f) plating a second conductive material in said second via hole; and g) removing said first and second sacrificial layer.

6. The method of claim 5, wherein said first conductive material is copper.

* * * * *